(12) United States Patent
Han

(10) Patent No.: US 7,145,375 B2
(45) Date of Patent: Dec. 5, 2006

(54) DUTY CYCLE DETECTOR WITH FIRST, SECOND, AND THIRD VALUES

(75) Inventor: Jonghee Han, Cary, NC (US)

(73) Assignee: Infineon Technologies AG, Munich (DE)

( * ) Notice: Subject to any disclaimer, the term of this patent is extended or adjusted under 35 U.S.C. 154(b) by 17 days.

(21) Appl. No.: 11/034,006

(22) Filed: Jan. 12, 2005

(65) Prior Publication Data

US 2006/0152266 A1     Jul. 13, 2006

(51) Int. Cl.
*H03K 3/017* (2006.01)
(52) U.S. Cl. .................... 327/175; 327/172
(58) Field of Classification Search ............. 327/175
See application file for complete search history.

(56) References Cited

U.S. PATENT DOCUMENTS

| 4,475,086 | A | 10/1984 | Allen | 328/112 |
| 4,799,022 | A * | 1/1989 | Skierszkan | 327/116 |
| 5,945,857 | A | 8/1999 | Havens | 327/175 |
| 6,320,438 | B1 | 11/2001 | Arcus | 327/175 |
| 6,765,421 | B1 | 7/2004 | Brox et al. | 327/175 |
| 2002/0140477 | A1 | 10/2002 | Zhou et al. | 327/175 |
| 2004/0075462 | A1 | 4/2004 | Kizer et al. | 326/29 |
| 2004/0189364 | A1 | 9/2004 | Lee et al. | 327/175 |

* cited by examiner

*Primary Examiner*—Long Nguyen
*Assistant Examiner*—Ryan C. Jager
(74) *Attorney, Agent, or Firm*—Dicke, Billig & Czaja, PLLC

(57) ABSTRACT

A duty cycle detector comprising a first circuit configured to receive clock cycles including a first level and a second level. The first circuit is configured to obtain a first value based on the length of the first level and to obtain second and third values based on the length of the second level. The first value is compared to the second and the third values to determine a duty cycle range of the clock cycles.

20 Claims, 4 Drawing Sheets

DUTY CYCLE DETECTOR WITH FIRST, SECOND, AND THIRD VALUES

BACKGROUND

Many digital circuits receive a clock signal to operate. One type of circuit that receives a clock signal to operate is a memory circuit, such as a dynamic random access memory (DRAM), synchronous dynamic random access memory (SDRAM), or double data rate synchronous dynamic random access memory (DDR-SDRAM). In a memory circuit operating at high frequencies, it is important to have a clock signal that has about a 50% duty cycle. This provides the memory circuit with approximately an equal amount of time on the high level phase and the low level phase of a clock cycle for transferring data, such as latching rising edge data and latching falling edge data into and out of the memory circuit.

Typically, a clock signal is provided by an oscillator, such as a crystal oscillator, and clock circuitry. The oscillator and clock circuitry often provide a clock signal that does not have a 50% duty cycle. For example, the clock signal may have a 45% duty cycle, where the high level phase is 45% of one clock cycle and the low level phase is the remaining 55% of the clock cycle. To correct or change the duty cycle of the clock signal, a duty cycle detector can indicate the duty cycle of the clock signal and the output of the duty cycle detector can be provided to the clock circuitry that corrects the clock signal to have about a 50% duty cycle.

For these and other reasons there is a need for the present invention.

SUMMARY

One aspect of the present invention provides a duty cycle detector comprising a first circuit configured to receive clock cycles including a first level and a second level. The first circuit is configured to obtain a first value based on the length of the first level and to obtain second and third values based on the length of the second level. The first value is compared to the second and the third values to determine a duty cycle range of the clock cycles.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
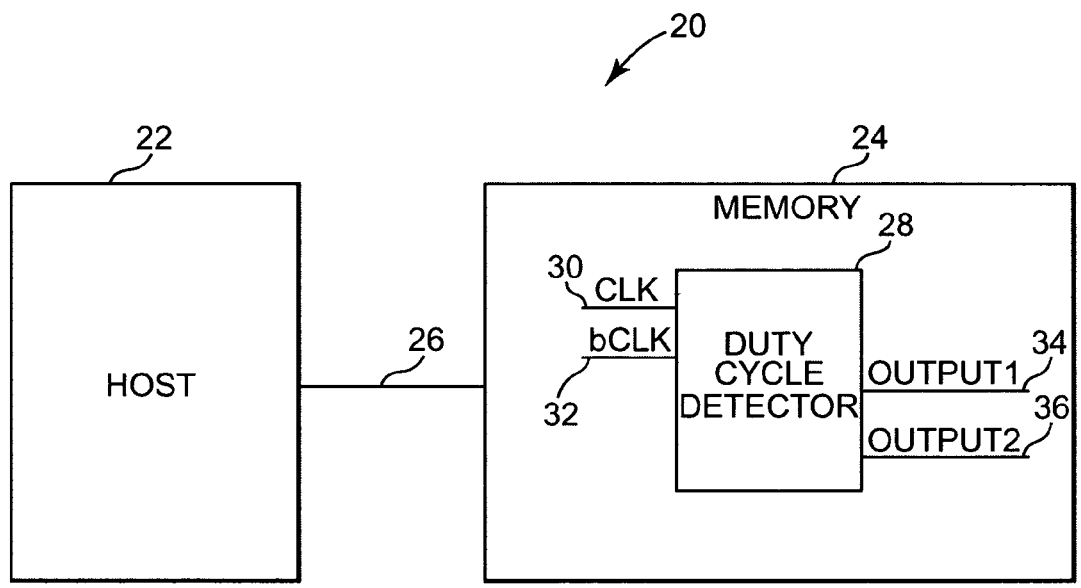
FIG. 1 is block diagram illustrating one embodiment of an electronic system according to the present invention.

FIG. 1 is a block diagram illustrating one embodiment of an electronic system 20 according to the present invention. Electronic system 20 includes a host 22 and a memory circuit 24. Host 22 is electrically coupled to memory circuit 24 via memory communications path 26. Host 22 can be any suitable electronic host, such as a computer system including a microprocessor or a microcontroller. Memory circuit 24 can be any suitable memory, such as a memory that utilizes a clock signal to operate. In one embodiment, memory circuit 24 comprises a random access memory, such as a dynamic random access memory (DRAM), synchronous dynamic random access memory (SDRAM), or double data rate synchronous dynamic random access memory (DDR-SDRAM).

Memory circuit 24 includes a duty cycle detector 28 that receives a clock signal CLK at 30 and an inverted clock signal bCLK at 32. Clock signal CLK at 30 is the inverse of inverted clock signal bCLK at 32. In one embodiment, duty cycle detector 28 receives clock signal CLK at 30 and/or inverted clock signal bCLK at 32 from host 22 via memory communications path 26. In other embodiments, duty cycle detector 28 receives clock signal CLK at 30 and/or inverted clock signal bCLK at 32 from any suitable device, such as a dedicated clock circuit that is part of memory circuit 24 or situated outside memory circuit 24.

Duty cycle detector 28 provides two output signals, OUTPUT1 at 34 and OUTPUT2 at 36, to indicate a duty cycle range of clock signal CLK at 30. Duty cycle detector 28 provides output signals, OUTPUT1 at 34 and OUTPUT2 at 36, to indicate whether the duty cycle of clock signal CLK at 30 is within a duty cycle range, greater than the duty cycle range, or less than the duty cycle range. Duty cycle detector 28 provides the output signals, OUTPUT1 at 34 and OUTPUT2 at 36, to the source of clock signal CLK at 30 and inverted clock signal bCLK at 32. The source, such as host 22 or a dedicated clock circuit that is part of memory circuit 24 or outside memory circuit 24, corrects the clock signal CLK at 30 and inverted clock signal bCLK at 32 to have a duty cycle within the duty cycle range. In one embodiment, the duty cycle range is centered around a 50% duty cycle.

Figure 2:
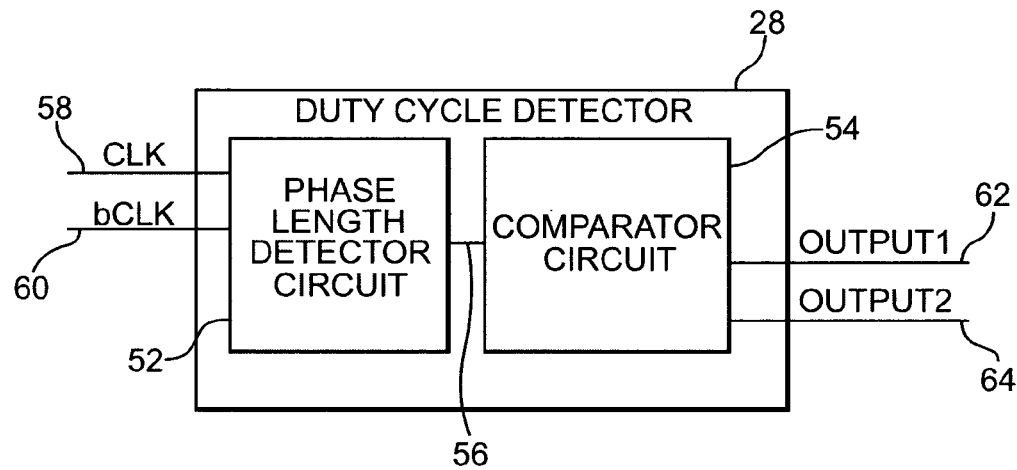
FIG. 2 is a block diagram illustrating one embodiment of a duty cycle detector according to the present invention.

FIG. 2 is a block diagram illustrating one embodiment of duty cycle detector 28 according to the present invention. Duty cycle detector 28 includes a phase length detector circuit 52 and a comparator circuit 54. Phase length detector circuit 52 is electrically coupled to comparator circuit 54 via comparator communications path 56.

Phase length detector circuit 52 receives clock signal CLK at 58 and inverted clock signal bCLK at 60 and provides three values to comparator circuit 54 via comparator communications path 56. Clock signal CLK at 58 is the inverse of inverted clock signal bCLK at 60. One of the three values represents the length of one phase of clock signal CLK at 58 and the other two of the three values represents the other phase of clock signal CLK at 58.

Comparator circuit 54 receives the three values and compares the one value that represents the length of one phase of clock signal CLK at 58 to each of the other two values. Comparator circuit 54 provides output signals, OUT- PUT1 at 62 and OUTPUT2 at 64, to indicate a duty cycle range of clock signal CLK at 58.

Figure 3:
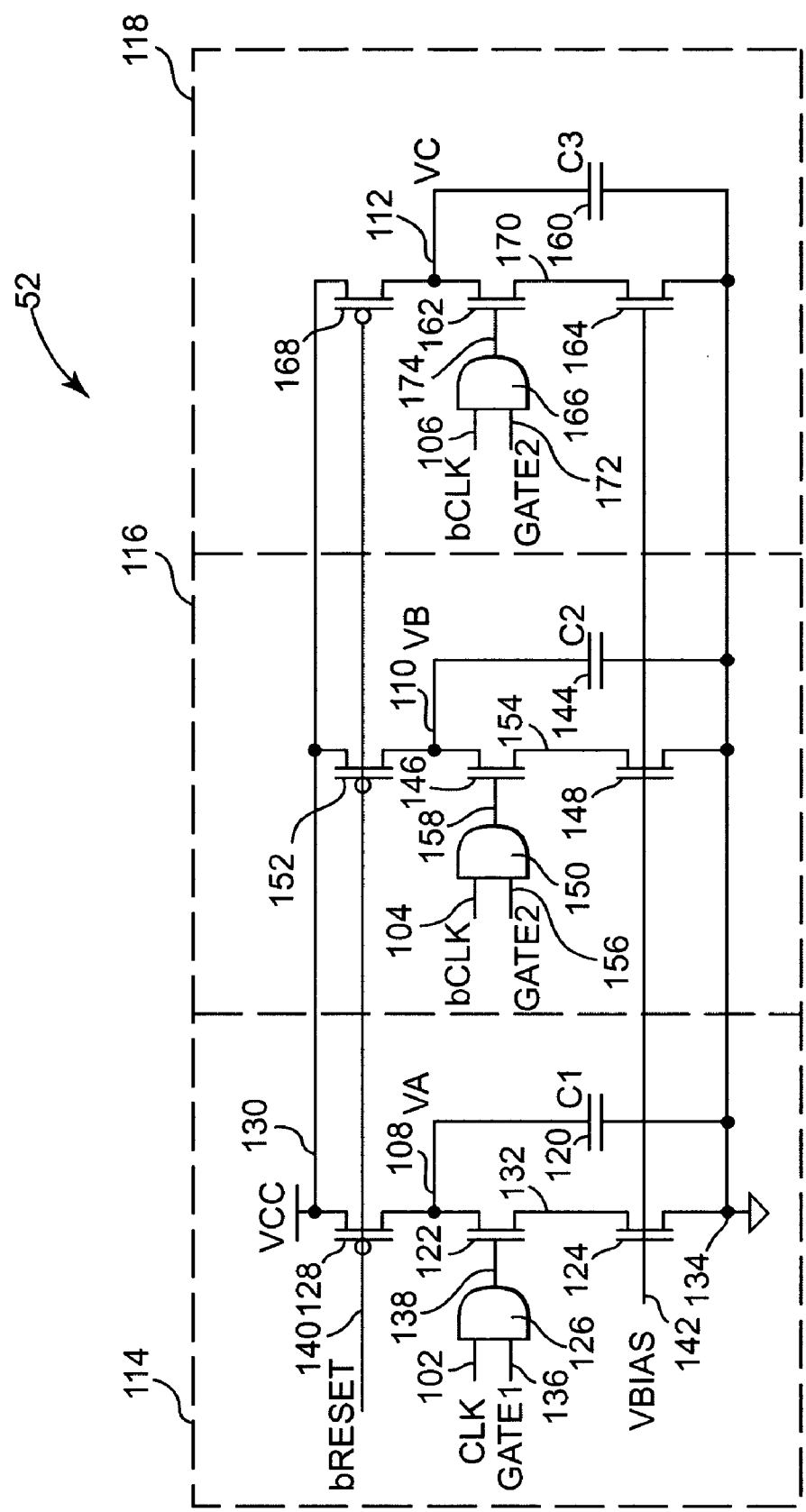
FIG. 3 is a diagram illustrating one embodiment of a phase length detector circuit.

FIG. 3 is a diagram illustrating one embodiment of phase length detector circuit 52. Phase length detector circuit 52 receives clock signal CLK at 102 and inverted clock signal bCLK at 104 and 106. Clock signal CLK at 102 is the inverse of inverted clock signal bCLK at 104 and 106. Phase length detector circuit 52 provides voltage values VA at 108, VB at 110, and VC at 112 to a comparator circuit, such as comparator circuit 54 (shown in FIG. 2).

Phase length detector circuit 52 includes a first phase length detector 114, a second phase length detector 116, and a third phase length detector 118. First phase length detector 114 receives clock signal CLK at 102 and provides voltage value VA at 108 that represents the length of the high level phase of clock signal CLK at 102. Second phase length detector 116 receives inverted clock signal bCLK at 104 and provides voltage value VB at 110 that is one representation of the length of the high level phase of inverted clock signal bCLK at 104, which is the length of the low level phase of clock signal CLK at 102. Third phase length detector 118 receives inverted clock signal bCLK at 106 and provides voltage value VC at 112 that is another representation of the length of the high level phase of inverted clock signal bCLK at 106, which is the length of the low level phase of clock signal CLK at 102. In other embodiments, first phase length detector 114 can receive inverted clock signal bCLK and second and third phase length detectors 116 and 118 can receive clock signal CLK.

First phase length detector 114 includes a first capacitor C1 at 120, a first switching transistor 122, a first bias transistor 124, a first logic gate 126, and a first reset transistor 128. First switching transistor 122 and first bias transistor 124 are n-channel metal oxide semiconductor (NMOS) transistors and first reset transistor 128 is a p-channel metal oxide semiconductor (PMOS) transistor. Also, first logic gate 126 is an AND gate. In other embodiments, first switching transistor 122, first bias transistor 124, and first reset transistor 128 can be any suitable type of transistor and first logic gate 126 can be any suitable logic gate.

One side of the drain-source path of first reset transistor 128 is electrically coupled to power VCC at 130 and the other side of the drain-source path of first reset transistor 128 is electrically coupled at 108 to one side of the drain-source path of first switching transistor 122 and one side of first capacitor C1 at 120. The other side of the drain-source path of first switching transistor 122 is electrically coupled at 132 to one side of the drain-source path of first bias transistor 124. The other side of the drain-source path of first bias transistor 124 is electrically coupled to a reference, such as ground, at 134 and the other side of first capacitor C1 at 120 is electrically coupled to the reference at 134.

First logic gate 126 receives clock signal CLK at 102 and a gating signal GATE1 at 136. The output of first logic gate 126 is electrically coupled at 138 to the gate of first switching transistor 122. Also, the gate of first reset transistor 128 receives an active low reset signal bRESET at 140 and the gate of first bias transistor 124 receives a bias voltage VBIAS at 142.

Clock signal CLK at 102 and gating signal GATE1 at 136 are provided to first logic gate 126. If gating signal GATE1 at 136 is at a low logic level, the output of first logic gate 126 is at a low logic level that turns off first switching transistor 122. With first switching transistor 122 turned off, reset signal bRESET at 140 is provided at a low voltage level to turn on first reset transistor 128 and charge first capacitor C1 at 120 to a high voltage level. Reset signal bRESET at 140 is switched to a high voltage level to turn off first reset transistor 128 and terminate charging of first capacitor C1 at 120. Also, bias voltage VBIAS at 142 is provided to the gate of first bias transistor 124 to bias first bias transistor 124 to conduct current.

Gating signal GATE1 at 136 is provided at a high logic level for one or more high level phases of clock signal CLK at 102. With gating signal GATE1 at 136 at a high logic level, the output of first logic gate 126 follows clock signal CLK at 102. If clock signal CLK at 102 is at a high logic level, the output of first logic gate 126 is at a high logic level to turn on first switching transistor 122 and current flows through first switching transistor 122 and first bias transistor 124 to the reference at 134. First capacitor C1 at 120 discharges with first switching transistor 122 turned on and the voltage value VA at 108 represents the length of the high level phase of clock signal CLK at 102.

Second phase length detector 116 includes a second capacitor C2 at 144, a second switching transistor 146, a second bias transistor 148, a second logic gate 150, and a second reset transistor 152. Second switching transistor 146 and second bias transistor 148 are NMOS transistors and second reset transistor 152 is a PMOS transistor. Also, second logic gate 150 is an AND gate. In other embodiments, second switching transistor 146, second bias transistor 148, and second reset transistor 152 can be any suitable type of transistor and second logic gate 150 can be any suitable logic gate.

One side of the drain-source path of second reset transistor 152 is electrically coupled to power VCC at 130 and the other side of the drain-source path of second reset transistor 152 is electrically coupled at 110 to one side of the drain-source path of second switching transistor 146 and one side of second capacitor C2 at 144. The other side of the drain-source path of second switching transistor 146 is electrically coupled at 154 to one side of the drain-source path of second bias transistor 148. The other side of the drain-source path of second bias transistor 148 is electrically coupled to the reference at 134 and the other side of second capacitor C2 at 144 is electrically coupled to the reference at 134.

Second logic gate 150 receives inverted clock signal bCLK at 104 and gating signal GATE2 at 156. The output of second logic gate 150 is electrically coupled at 158 to the gate of second switching transistor 146. Also, the gate of second reset transistor 152 receives active low reset signal bRESET at 140 and the gate of second bias transistor 148 receives bias voltage VBIAS at 142.

Inverted clock signal bCLK at 104 and gating signal GATE2 at 156 are provided to second logic gate 150. If gating signal GATE2 at 156 is at a low logic level, the output of second logic gate 150 is at a low logic level that turns off second switching transistor 146. With second switching transistor 146 turned off, reset signal bRESET at 140 is provided at a low voltage level to turn on second reset transistor 152 and charge second capacitor C2 at 144 to a high voltage level. Reset signal bRESET at 140 is switched to a high voltage level to turn off second reset transistor 152 and terminate charging of second capacitor C2 at 144. Also, bias voltage VBIAS at 142 is provided to the gate of second bias transistor 148 to bias second bias transistor 148 to conduct current.

Gating signal GATE2 at 156 is provided at a high logic level for one or more high level phases of inverted clock signal bCLK at 104. With gating signal GATE2 at 156 at a high logic level, the output of second logic gate 150 follows inverted clock signal bCLK at 104. If inverted clock signal bCLK at 104 is at a high logic level, the output of second logic gate 150 is at a high logic level to turn on second switching transistor 146. Current flows through second switching transistor 146 and second bias transistor 148 to the reference at 134. Second capacitor C2 at 144 discharges with second switching transistor 146 turned on and voltage value VB at 110 represents the length of the high level phase of inverted clock signal bCLK at 104, which is the low level phase of clock signal CLK at 102.

Third phase length detector 118 includes a third capacitor C3 at 160, a third switching transistor 162, a third bias transistor 164, a third logic gate 166, and a third reset transistor 168. Third switching transistor 162 and third bias transistor 164 are NMOS transistors and third reset transistor 168 is a PMOS transistor. Also, third logic gate 166 is an AND gate. In other embodiments, third switching transistor 162, third bias transistor 164, and third reset transistor 168 can be any suitable type of transistor and third logic gate 166 can be any suitable logic gate.

One side of the drain-source path of third reset transistor 168 is electrically coupled to power VCC at 130 and the other side of the drain-source path of third reset transistor 168 is electrically coupled at 112 to one side of the drain-source path of third switching transistor 162 and one side of third capacitor C3 at 160. The other side of the drain-source path of third switching transistor 162 is electrically coupled at 170 to one side of the drain-source path of third bias transistor 164. The other side of the drain-source path of third bias transistor 164 is electrically coupled to the reference at 134 and the other side of third capacitor C3 at 160 is electrically coupled to the reference at 134.

Third logic gate 166 receives inverted clock signal bCLK at 106 and gating signal GATE2 at 172. The output of third logic gate 166 is electrically coupled at 174 to the gate of third switching transistor 162. Also, the gate of third reset transistor 168 receives active low reset signal bRESET at 140 and the gate of third bias transistor 164 receives bias voltage VBIAS at 142.

Inverted clock signal bCLK at 106 and gating signal GATE2 at 172 are provided to third logic gate 166. If gating signal GATE2 at 172 is at a low logic level, the output of third logic gate 166 is at a low logic level that turns off third switching transistor 162. With third switching transistor 162 turned off, reset signal bRESET at 140 is provided at a low voltage level to turn on third reset transistor 168 and charge third capacitor C3 at 160 to a high voltage level. Reset signal bRESET at 140 is switched to a high voltage level to turn off third reset transistor 168 and terminate charging of third capacitor C3 at 160. Also, bias voltage VBIAS at 142 is provided to the gate of third bias transistor 164 to bias third bias transistor 164 to conduct current.

Gating signal GATE2 at 172 is provided at a high logic level for one or more high level phases of inverted clock signal bCLK at 106. With gating signal GATE2 at 172 at a high logic level, the output of third logic gate 166 follows inverted clock signal bCLK at 106. If inverted clock signal bCLK at 106 is at a high logic level, the output of third logic gate 166 is at a high logic level to turn on third switching transistor 162 and current flows through third switching transistor 162 and third bias transistor 164 to the reference at 134. Third capacitor C3 at 160 discharges with third switching transistor 162 turned on and the voltage value VC at 112 represents the length of the high level phase of inverted clock signal bCLK at 106, which is the low level phase of clock signal CLK at 102.

In phase length detector circuit 52, each of the capacitors including first capacitor C1 at 120, second capacitor C2 at 144, and third capacitor C3 at 160 has a different capacitive value as compared to the other capacitors. First capacitor C1 at 120 has a capacitive value that is situated midway between the capacitive value of second capacitor C2 at 144 and the capacitive value of third capacitor C3 at 160. First capacitor C1 at 120 has a capacitive value of CV, second capacitor C2 at 144 has a capacitive value of CV times (1−X), and third capacitor C3 at 160 has a capacitive value of CV times (1+X), where X is a percentage of capacitive value CV, such as 4%. Capacitive value CV can be in any suitable capacitive value range, such as the picofarad range or the nanofarad range. In other embodiments, first capacitor C1 at 120 can have any suitable capacitive value in relation to the capacitive values of second capacitor C2 at 144 and third capacitor C3 at 160.

In operation, phase length detector circuit 52 receives clock signal CLK at 102 and inverted clock signal bCLK at 104 and 106. Also, phase length detector circuit 52 receives bias voltage VBIAS at 142 to bias each of the bias transistors, including first bias transistor 124, second bias transistor 148, and third bias transistor 164, to the same bias voltage level. Thus, each of the bias transistors is biased to conduct the same amount of current.

The gating signals GATE1 at 136 and GATE2 at 156 and 172 are provided at a low logic level to turn off each of the switching transistors, including first switching transistor 122, second switching transistor 146, and third switching transistor 162. With each of the switching transistors turned off, the active low reset signal bRESET at 140 is provided at a low voltage level to turn on the reset transistors, including first reset transistor 128, second reset transistor 152, and third reset transistor 168. With each of the reset transistors turned on, the capacitors, including first capacitor C1 at 120, second capacitor C2 at 144, and third capacitor C3 at 160, are charged to a high voltage level, such as close to VCC. After charging the capacitors, the active low reset signal bRESET at 140 is set to a high voltage level to turn off the reset transistors and terminate charging the capacitors.

Next, gating signal GATE1 at 136 is provided at a high logic level to gate clock signal CLK at 102 to first switching transistor 122. Also, gating signal GATE2 at 156 and 172 is provided at a high logic level to gate inverted clock signal bCLK at 104 and 106 to second switching transistor 146 and third switching transistor 162. Gating signal GATE1 at 136 is provided at a high logic level from before a high phase level in clock signal CLK at 102 until after a high phase level in clock signal CLK at 102. Gating signal GATE2 at 156 and 172 is provided at a high logic level from before a high phase level in inverted clock signal bCLK at 104 and 106 until after a high phase level in inverted clock signal bCLK at 104 and 106. Gating signal GATE1 at 136 and gating signal GATE2 at 156 and 172 are provided at a high logic level for the same number of high phase levels.

For example, gating signal GATE1 at 136 is provided at a high logic level for one high phase level of clock signal CLK at 102. With gating signal GATE1 at 136 at a high logic level, clock signal CLK at 102 transitions to a high logic level that turns on first switching transistor 122. With first switching transistor 122 turned on to conduct current, first capacitor 120 discharges through first switching transistor 122 and first bias transistor 124. As clock signal CLK at 102 transitions to a low logic level, first switching transistor 122 is turned off and first capacitor 120 discontinues discharging. Gating signal GATE1 at 136 is switched to a low logic level and the resulting voltage value VA at 108 represents the length of the high level phase of clock signal CLK at 102.

Also, gating signal GATE2 at 156 and 172 is provided at a high logic level for one high phase level of inverted clock signal bCLK at 104 and 106. As clock signal CLK at 102 transitions to a low logic level, inverted clock signal bCLK at 104 and 106 transitions to a high logic level that turns on second switching transistor 146 and third switching transistor 162. With second switching transistor 146 turned on to conduct current, second capacitor 144 discharges through second switching transistor 146 and second bias transistor 148. With third switching transistor 162 turned on to conduct current, third capacitor 160 discharges through third switching transistor 162 and third bias transistor 164. As inverted clock signal bCLK at 104 and 106 transitions to a low logic level, second switching transistor 146 and third switching transistor 162 are turned off and second capacitor 144 and third capacitor 160 discontinue discharging. Gating signal GATE2 is provided at a low logic level and the resulting voltage values VB at 110 and VC at 112 are representations of the length of the high level phase of inverted clock signal bCLK at 104 and 106, which is the length of the low level phase of clock signal CLK at 102.

The capacitive value of second capacitor C2 at 144 is smaller than the capacitive value of third capacitor C3 at 160 and second capacitor C2 at 144 discharges faster than third capacitor C3 at 160. Thus, the resulting voltage value VB at 110 is less than the resulting voltage value VC at 112. If the resulting voltage value VA at 108 is between the resulting voltage value VB at 110 and the resulting voltage value VC at 112, clock signal CLK at 102 has a duty cycle within a predetermined duty cycle range defined by the capacitive values of the capacitors, including first capacitor C1 at 120, second capacitor C2 at 144, and third capacitor C3 at 160. In one embodiment, if the capacitive value of first capacitor C1 at 120 is capacitive value CV and the capacitive value of second capacitor C2 at 144 is capacitive value CV minus 4% and the capacitive value of third capacitor C3 at 160 is capacitive value CV plus 4%, a resulting voltage value VA at 108 between the resulting voltage value VB at 110 and the resulting voltage value VC at 112 indicates a duty cycle in the range of 49% to 51% (or 50% plus or minus 1%). In other embodiments, the relationship between the capacitive values of the capacitors and the duty cycle range can be any suitable relationship.

If the resulting voltage value VA at 108 is less than the resulting voltage value VB at 110, the high level phase is high for a longer length of time than the low level phase and the duty cycle of clock signal CLK at 102 is greater than the predetermined duty cycle range.

If the resulting voltage value VA at 108 is greater than the resulting voltage value VC at 112, the high level phase is high for a shorter length of time than the low level phase and the duty cycle of clock signal CLK at 102 is less than the predetermined duty cycle range.

Figure 4:
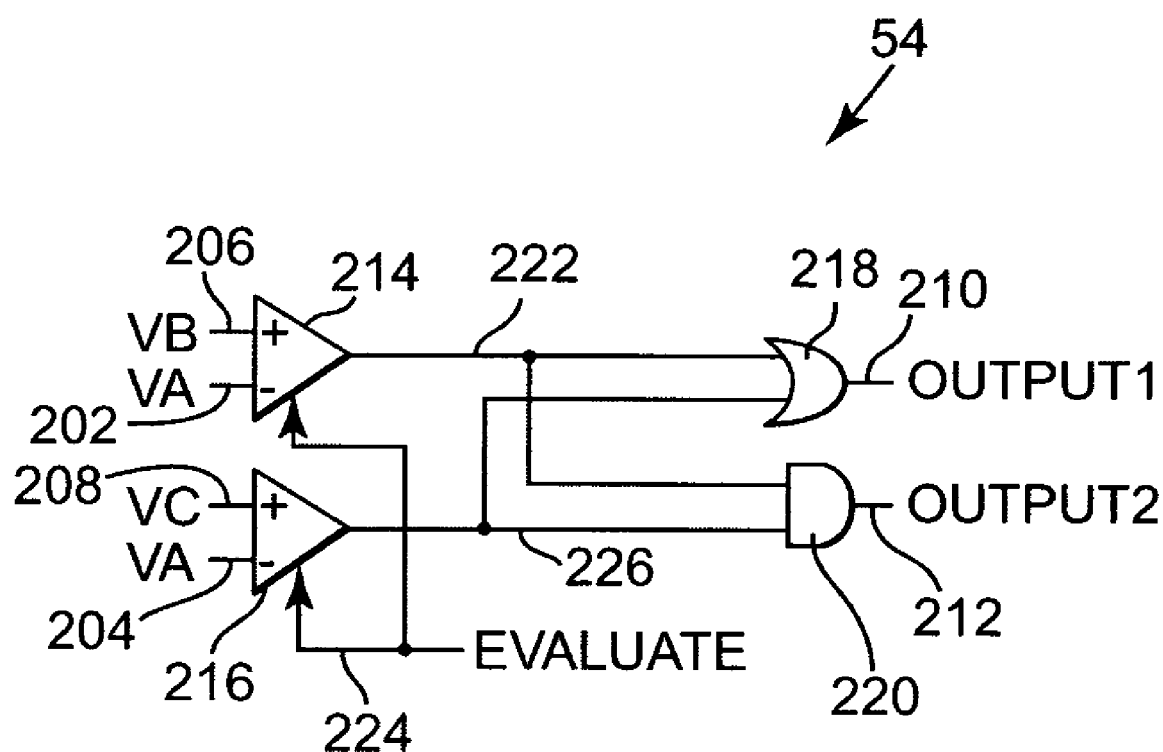
FIG. 4 is a diagram illustrating one embodiment of a comparator circuit.

FIG. 4 is a diagram illustrating one embodiment of a comparator circuit 54. Comparator circuit 54 receives voltage value VA at 202 and 204, voltage value VB at 206, and voltage value VC at 208. Comparator circuit 54 compares voltage value VA at 202 and 204 to voltage value VB at 206 and to voltage value VC at 208 and provides outputs OUTPUT1 at 210 and OUTPUT2 at 212. The outputs indicate the duty cycle range of clock signal CLK, such as clock signal CLK 102 (shown in FIG. 3).

Comparator circuit 54 includes a first comparator 214, a second comparator 216, an OR gate 218, and an AND gate 220. The negative input of first comparator 214 receives voltage value VA at 202 and the positive input of first comparator 214 receives voltage value VB at 206. The output of first comparator 214 is electrically coupled to one input of OR gate 218 and to one input of AND gate 220 via first output path 222. Also, first comparator 214 receives an enable signal EVALUATE at 224 that enables first comparator 214 to provide an output on first output path 222.

The negative input of second comparator 216 receives voltage value VA at 204 and the positive input of second comparator 216 receives voltage value VC at 208. The output of second comparator 216 is electrically coupled to one input of OR gate 218 and to one input of AND gate 220 via second output path 226. Also, second comparator 216 receives enable signal EVALUATE at 224 that enables the second comparator 216 to provide an output on second output path 226.

In operation, voltage value VA at 202 and 204, voltage value VB at 206, and voltage value VC at 208 are provided to comparator circuit 54 from a phase length detector circuit, such as phase length detector circuit 52 (shown in FIG. 2) and phase length detector circuit 52 of FIG. 3. Also, first comparator 214 and second comparator 216 receive enable signal EVALUATE at 224 to enable the outputs of first comparator 214 and second comparator 216.

If voltage value VA at 202 and 204 is greater than voltage value VB at 206 and less than voltage value VC at 208, the output of first comparator 214 is at a low logic level and the output of second comparator 216 is at a high logic level. In response, the output of OR gate 218 provides a high logic level output signal OUTPUT1 at 210 and the output of AND gate 220 provides a low logic level output signal OUTPUT2 at 212. A high output signal OUTPUT1 at 210 and a low output signal OUTPUT2 at 212 indicate voltage value VA at 202 and 204 is between voltage value VB at 206 and voltage value VC at 208 and in the predetermined duty cycle range, such as between 49% and 51%.

If voltage value VA at 202 and 204 is less than voltage value VB at 206, then voltage value VA at 202 and 204 is also less than voltage value VC at 208. The output of first comparator 214 is at a high logic level and the output of second comparator 216 is at a high logic level. In response, the output of OR gate 218 provides a high logic level output signal OUTPUT1 at 210 and the output of AND gate 220 provides a high logic level output signal OUTPUT2 at 212. A high output signal OUTPUT1 at 210 and a high output signal OUTPUT2 at 212 indicate voltage value VA at 202 and 204 is less than voltage value VB at 206 and voltage value VC at 208 and clock cycle CLK has a duty cycle that is greater than the predetermined duty cycle range, such as greater than 51%.

If voltage value VA at 202 and 204 is greater than voltage value VC at 208, then voltage value VA at 202 and 204 is also greater than voltage value VB at 206. The output of first comparator 214 is at a low logic level and the output of second comparator 216 is at a low logic level. In response, the output of OR gate 218 provides a low logic level output signal OUTPUT1 at 210 and the output of AND gate 220 provides a low logic level output signal OUTPUT2 at 212. A low output signal OUTPUT1 at 210 and a low output signal OUTPUT2 at 212 indicate voltage value VA at 202 and 204 is greater than voltage value VB at 206 and voltage value VC at 208 and clock cycle CLK has a duty cycle that is less than the predetermined duty cycle range, such as less than 49%.

Figure 5:
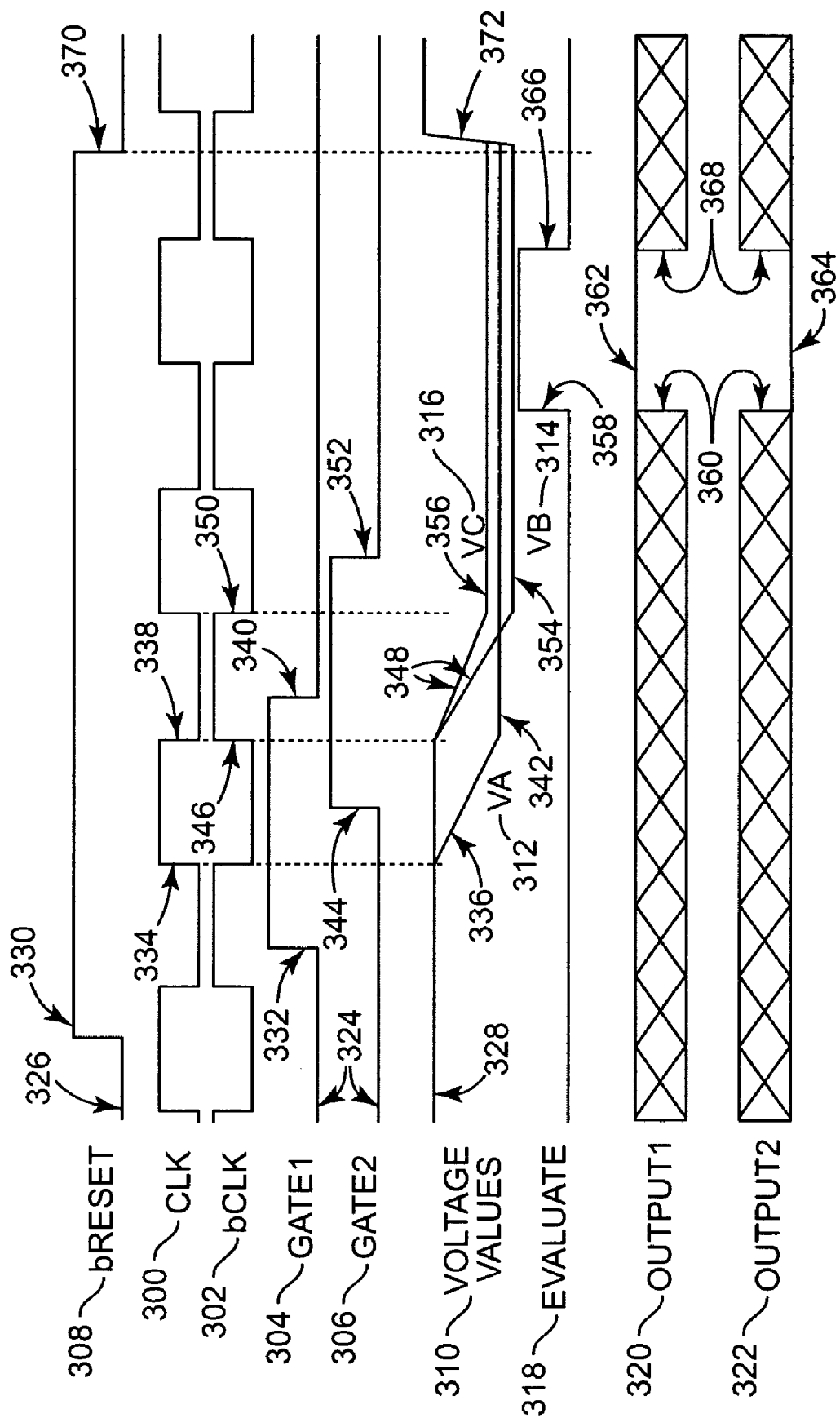
FIG. 5 is a timing diagram illustrating the operation of one embodiment of a duty cycle detector according to the present invention.

FIG. 5 is a timing diagram illustrating the operation of one embodiment of a duty cycle detector according to the present invention. The duty cycle detector is similar to duty cycle detector 28 of FIG. 2. The duty cycle detector includes a phase length detector circuit, such as phase length detector circuit 52 of FIG. 3, and a comparator circuit, such as comparator circuit 54 of FIG. 4.

The phase length detector circuit receives clock signal CLK at 300 and inverted clock signal bCLK at 302, which is the inverse of clock signal CLK at 300. Also, the phase length detector circuit receives gating signals GATE1 at 304 and GATE2 at 306 and the active low reset signal bRESET at 308. In addition, the phase length detector circuit receives a bias voltage (not shown), such as bias voltage VBIAS (shown in FIG. 3), to bias the bias transistors 124, 148, and 164 to conduct current.

The phase length detector provides voltage values at 310, including voltage value VA at 312, voltage value VB at 314, and voltage value VC at 316 to the comparator circuit. An enable signal EVALUATE at 318 is received by the comparator circuit to enable outputs from the comparators. The comparator circuit provides output signals OUTPUT1 at 320 and OUTPUT2 at 322.

To begin, gating signals GATE1 at 304 and GATE2 at 306 are provided at a low logic level at 324 to turn off switching transistors 122, 146, and 162. The reset signal bRESET at 308 is at a low logic level at 326 to turn on reset transistors 128, 152, and 168 and charge capacitors 120, 144, and 160 to high voltage levels, indicated at 328. To obtain a duty cycle range, reset signal bRESET at 308 is switched to a high voltage level at 330 to turn off reset transistors 128, 152, and 168 and discontinue charging capacitors 120, 144, and 160.

Gating signal GATE1 at 304 transitions to a high logic level at 332, while clock signal CLK at 300 is at a low level. At 334, clock signal CLK at 300 switches to a high level that turns on first switching transistor 122 and begins to discharge first capacitor 120. Voltage value VA at 312 drops at 336 as first capacitor 120 discharges. At 338, clock signal CLK at 300 switches to a low level that turns off first switching transistor 122 and discontinues discharging first capacitor 120. At 340, gating signal GATE1 at 304 switches to a low logic level and at 342 the resulting voltage value VA at 312 on first capacitor 120 represents the length of the high level phase of clock signal CLK at 300.

Gating signal GATE2 at 306 transitions to a high logic level at 344, while inverted clock signal bCLK at 302 is at a low level. At 346, inverted clock signal bCLK at 302 transitions to a high level, which turns on second switching transistor 146 and third switching transistor 162. With second switching transistor 146 and third switching transistor 162 turned on, second capacitor 144 and third capacitor 160 begin to discharge. At 348, since the capacitive value of second capacitor 144 is smaller than the capacitive value of third capacitor 160, voltage value VB at 314 discharges faster than voltage value VC at 316. At 350, inverted clock signal bCLK at 302 transitions to a low level that turns off second switching transistor 146 and third switching transistor 162. Turning off second switching transistor 146 and third switching transistor 162 discontinues discharging second capacitor 144 and third capacitor 160. At 352, gating signal GATE2 at 306 switches to a low logic level. At 354, the resulting voltage value VB at 314 on second capacitor 144 is one representation of the length of the high level phase of inverted clock signal bCLK at 302, which is the length of the low level phase of clock signal CLK at 300. At 356, the resulting voltage value VC at 316 on third capacitor 160 is another representation of the length of the high level phase of inverted clock signal bCLK at 302, which is the length of the low level phase of clock signal CLK at 300.

At 358, enable signal EVALUATE at 318 transitions to a high voltage level to enable first comparator 214 and second comparator 216. Output signal OUTPUT1 at 320 and output signal OUTPUT2 at 322 become valid at 360. With voltage value VA at 312 between voltage value VB at 314 and voltage value VC at 316, output signal OUTPUT1 at 320 is at a high logic level at 362 and output signal OUTPUT2 at 322 is at a low logic level at 364. Enable signal EVALUATE at 318 transitions to a low voltage level at 366 to tri-state first comparator 214 and second comparator 216. Output signal OUTPUT1 at 320 and output signal OUTPUT2 at 322 become invalid at 368. Reset signal bRESET at 308 transitions to a low level at 370 that charges capacitors 120, 144, and 160 and voltage values, voltage value VA at 312, voltage value VB at 314, and voltage value VC at 316, to high voltage levels at 372.

The duty cycle detector provides the output signals, OUTPUT1 at 320 and OUTPUT2 at 322, to the source of clock signal CLK at 300 and inverted clock signal bCLK at 302. The source receives the valid output signals, OUTPUT1 at 320 and OUTPUT2 at 322, between 360 and 368. If the valid output signals, OUTPUT1 at 320 and OUTPUT2 at 322, indicate the duty cycle of clock signal CLK at 300 is not within the duty cycle range, the source corrects the clock signal CLK at 300 and inverted clock signal bCLK at 302 to have a duty cycle closer to and eventually within the duty cycle range.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A duty cycle detector, comprising:
a first circuit configured to receive clock cycles including a first level and a second level and to obtain a first value based on the length of the first level and to obtain second and third values based on the length of the second level, wherein the first value is compared to the second and the third values to determine a duty cycle range of the clock cycles, wherein the first circuit comprises a switch and the first circuit is configured to gate the clock cycles and provide the gated clock cycles to the switch to regulate current flow through the switch to obtain the first value.

2. A duty cycle detector, comprising:
a first circuit configured to receive clock cycles including a first level and a second level and to obtain a first value based on the length of the first level and to obtain second and third values based on the length of the second level, wherein the first value is compared to the second and the third values to determine a duty cycle range of the clock cycles, wherein the first circuit comprises a switch and the first circuit is configured to gate the clock cycles and provide the gated clock cycles to the switch to regulate current flow through the switch to obtain at least one of the second value and the third value.

3. A duty cycle detector, comprising:
a first circuit configured to receive clock cycles including a first level and a second level and to obtain a first value based on the length of the first level and to obtain second and third values based on the length of the second level, wherein the first value is compared to the second and the third values to determine a duty cycle range of the clock cycles, wherein the first circuit comprises:
a first capacitor configured to have a first capacitive value;
a second capacitor configured to have a second capacitive value; and
a third capacitor configured to have a third capacitive value, wherein the first capacitive value is between the second capacitive value and the third capacitive value.

4. The duty cycle detector of claim 3, wherein the first circuit is configured to regulate current flow of the first capacitor based on the length of the first level to obtain the first value.

5. The duty cycle detector of claim 3, wherein the first circuit is configured to regulate current flow of the second capacitor and the third capacitor based on the length of the second level to obtain the second value and the third value.

6. The duty cycle detector of claim 3, wherein the first circuit is configured to charge the first capacitor and the second capacitor and the third capacitor to a charged value, and to discharge the first capacitor to the first value based on the length of the first level, and to discharge the second capacitor to the second value and the third capacitor to the third value based on the length of the second level.

7. A duty cycle detector, comprising:
a first circuit configured to receive clock cycles including a first level and a second level and to obtain a first value based on the length of the first level and to obtain second and third values based on the length of the second level, wherein the first circuit performs a comparison of the first value to the second and the third values to determine a duty cycle range of the clock cycles, wherein the first circuit includes a second circuit configured to perform the comparison of the first value to the second and the third values and provide logic signals that indicate the duty cycle range.

8. The duty cycle detector of claim 7, wherein the second circuit comprises:
a first comparator configured to receive the first value and the second value to provide a first output signal;
a second comparator configured to receive the first value and the third value to provide a second output signal; and
logic gates configured to receive the first output signal and the second output signal to provide the logic signals that indicate the duty cycle range.

9. A random access memory, comprising:
a detector configured to receive clock signals and provide output signals that indicate a duty cycle range of the received clock signals, wherein the detector comprises:
a first circuit including:
a first switch;
a second switch; and
a third switch, wherein the first circuit is configured to regulate a first current flow through the first switch based on a first level of the clock signals to obtain a first value and to regulate a second current flow through the second switch based on a second level of the clock signals to obtain a second value and to regulate a third current flow through the third switch based on the second level of the clock signals to obtain a third value; and
a second circuit configured to compare the first value and the second value and compare the first value and the third value to provide the output signals.

10. The random access memory of claim 9, wherein the second circuit is configured to indicate the first value is in one of three duty cycle ranges including a first duty cycle range that is between the second value and the third value, a second duty cycle range that is less than the first duty cycle range, and a third duty cycle range that is greater than the first duty cycle range.

11. The random access memory of claim 9, wherein the first circuit comprises:
a first capacitor configured to have a first capacitive value;
a second capacitor configured to have a second capacitive value; and
a third capacitor configured to have a third capacitive value, wherein the first capacitive value is between the second capacitive value and the third capacitive value.

12. The random access memory of claim 11, wherein the first switch regulates current flow of the first capacitor to arrive at the first value, the second switch regulates current flow of the second capacitor to arrive at the second value, and the third switch regulates current flow of the third capacitor to arrive at the third value.

13. A duty cycle detector, comprising:
means for receiving clock signals including a first level and a second level;
means for obtaining a first value based on the length of the first level;
means for obtaining a second value based on the length of the second level;
means for obtaining a third value based on the length of the second level; and
means for comparing the first value to the second value and the third value to provide output signals that indicate a duty cycle range of the clock signals, wherein the means for obtaining the first value comprises:
means for gating the received clock signals to provide gated clock signals; and
means for regulating current flow based on the gated clock signals and the length of the first level.

14. The duty cycle detector of claim 13, wherein the means for comparing comprises:
means for comparing the first value and the second value;
means for comparing the first value and the third value; and
means for providing the output signals based on the results of comparing the first value and the second value and comparing the first value and the third value.

15. A duty cycle detector, comprising:
means for receiving clock signals including a first level and a second level;
means for obtaining a first value based on the length of the first level;
means for obtaining a second value based on the length of the second level;
means for obtaining a third value based on the length of the second level; and
means for comparing the first value to the second value and the third value to provide output signals that indicate a duty cycle range of the clock signals, wherein the means for obtaining the second value and the means for obtaining the third value comprises:
means for gating the received clock signals to provide gated clock signals; and
means for regulating current flow based on the gated clock signals and the length of the second level.

16. A duty cycle detector, comprising:
means for receiving clock signals including a first level and a second level;
means for obtaining a first value based on the length of the first level;

means for obtaining a second value based on the length of the second level;

means for obtaining a third value based on the length of the second level; and means for comparing the first value to the second value and the third value to provide output signals that indicate a duty cycle range of the clock sianals, wherein the means for obtaining the first value and the means for obtaining the second value and the means for obtaining the third value, comprises:

means for charging capacitors; and means for discharging the capacitors based on the lengths of the first level and the second level.

17. A method for detecting a duty cycle, comprising:

receiving clock signals including a first level and a second level;

obtaining a first value based on the length of the first level;

obtaining a second value based on the length of the second level;

obtaining a third value based on the length of the second level;

comparing the first value to the second value and the third value to provide output signals that indicate a duty cycle range of the clock signals;

providing output signals that indicate the first value is in one of three duty cycle ranges including:

a first duty cycle range that is between the second value and the third value;

a second duty cycle range that is less than the first duty cycle range; and a third duty cycle range that is greater than the first duty cycle range.

18. The method of claim 17, wherein comparing the first value comprises:

comparing the first value and the second value to obtain a first result;

comparing the first value and the third value to obtain a second result; and providing the output signals based on the first result and the second result.

19. A method for detecting a duty cycle, comprising:

receiving clock signals including a first level and a second level;

obtaining a first value based on the length of the first level;

obtaining a second value based on the length of the second level;

obtaining a third value based on the length of the second level; and comparing the first value to the second value and the third value to provide output signals that indicate a duty cycle range of the clock signals, wherein obtaining the first value comprises:

gating the received clock signals to provide gated clock signals;

charging a first capacitor to a charged value; and discharging the first capacitor based on the length of the first level in the gated clock signals.

20. The method of claim 19, wherein:

obtaining the second value comprises:

charging a second capacitor; and discharging the second capacitor based on the length of the second level in the gated clock signals; and obtaining the third value comprises:

charging a third capacitor; and discharging the third capacitor based on the length of the second level in the gated clock signals.

* * * * *